(12) United States Patent
Jeon et al.

(10) Patent No.: US 7,106,617 B2
(45) Date of Patent: Sep. 12, 2006

(54) FERROELECTRIC MEMORY DEVICES HAVING A PLATE LINE CONTROL CIRCUIT AND METHODS FOR OPERATING THE SAME

(75) Inventors: Byung-Gil Jeon, Kyunggi-do (KR); Ki-nam Kim, Kyungki-do (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 11/029,616

(22) Filed: Jan. 5, 2005

(65) Prior Publication Data
US 2005/0117383 A1 Jun. 2, 2005

Related U.S. Application Data

(62) Division of application No. 10/358,550, filed on Feb. 5, 2003, now Pat. No. 6,847,537.

(30) Foreign Application Priority Data
May 21, 2002 (KR) .............................. 2002-28062

(51) Int. Cl.
*G11C 11/22* (2006.01)
(52) U.S. Cl. ...................................... 365/145; 365/149
(58) Field of Classification Search .................. None
See application file for complete search history.

(56) References Cited
U.S. PATENT DOCUMENTS

| | | | |
|---|---|---|---|
| 5,198,994 A | 3/1993 | Natori | 365/145 |
| 5,523,964 A | 6/1996 | McMillan et al. | 365/145 |
| 5,579,258 A | 11/1996 | Adachi | 365/145 |
| 5,592,410 A | 1/1997 | Verhaeghe et al. | 365/145 |
| 5,638,318 A | 6/1997 | Seyyedy | 365/145 |
| 5,815,430 A | 9/1998 | Verhaeghe et al. | 365/145 |
| 5,940,316 A | 8/1999 | Koike | 365/145 |
| 5,991,188 A | 11/1999 | Chung et al. | 365/145 |
| 6,483,738 B1 * | 11/2002 | Kang et al. | 365/145 |
| 6,501,674 B1 * | 12/2002 | Ashikaga | 365/145 |
| 6,566,698 B1 | 5/2003 | Nishihara et al. | 257/295 |
| 6,826,099 B1 * | 11/2004 | Joachim et al. | 365/201 |

* cited by examiner

*Primary Examiner*—Son Mai
(74) *Attorney, Agent, or Firm*—Myers Bigel Sibley & Sajovec

(57) ABSTRACT

Ferroelectric memory devices include a ferroelectric memory cell. The ferroelectric memory cell has at least one bit line and a plate line. A control circuit drives the at least one bit line with write data substantially concurrently with activation of the plate line during a write operation. The memory devices may also include a sense amplifier coupled to the ferroelectric memory cell and the control circuit may be further configured to deactivate the plate line substantially concurrently with activation of the sense amplifier during a read operation.

14 Claims, 8 Drawing Sheets

FERROELECTRIC MEMORY DEVICES HAVING A PLATE LINE CONTROL CIRCUIT AND METHODS FOR OPERATING THE SAME

RELATED APPLICATION

This application claims priority to and is a divisional of parent application Ser. No. 10/358,550, filed Feb. 5,2003 now U.S. Pat. No. 6,847,537, which claims the benefit of Korean Patent Application No. 2002-28062, filed May 21, 2002, the disclosures of which are hereby incorporated herein by reference.

BACKGROUND OF THE INVENTION

The present invention relates to integrated circuit devices and, more particularly, to ferroelectric integrated circuit devices, such as memory devices, and methods for operating the same.

Recently, ferroelectric memory devices using ferroelectric layers have been considered as an alternative approach for certain memory applications. Ferroelectric memory devices are generally divided into two categories. The first category includes devices using a ferroelectric capacitor as described, for example, in U.S. Pat. No. 5,523,964. The second category includes devices having a ferroelectric field emission transistor (FET) as described, for example, in U.S. Pat. No. 5,198,994. Ferroelectric memory devices generally use polarization inversion and remnant polarization characteristics of an included ferroelectric layer to provide desired properties to the memory devices. These devices may provide higher-speed read and write operations and/or lower power consumption than other types of memory devices.

Because polarization inversion of a ferroelectric layer results from rotation of a dipole, ferroelectric memory devices may have an operation speed over 100 times faster than other nonvolatile memory devices, such as Electrical Erasable Programmable Read Only Memory (EEPROM) devices or flash memory devices. In addition, with optimized designs, ferroelectric memory devices may result in write operation speeds ranging from several hundreds of nanoseconds to several tens of nanoseconds. Such high speed operations may even be comparable to the operating speed of Dynamic Random Access Memory (DRAM) devices. With respect to possible power savings, EEPROM or flash memory devices typically require use of a high voltage of about 18 volts (V) through about 22 V for a write operation. Ferroelectric memory devices generally only need about 2 V through about 5 V for polarization inversion. Accordingly, they may be designed to operate with a single low-voltage power supply.

Ferroelectric memory cells generally store a logic state based on electric polarization of a ferroelectric capacitor as noted above. The ferroelectric capacitor typically has a dielectric material that includes a ferroelectric material, such as lead zirconate titanate (PZT). When voltages are applied to both electrodes (or plates) of a ferroelectric capacitor, the ferroelectric material is generally polarized in the direction of the resulting electric field. The switching threshold for changing the polarization state of the ferroelectric capacitor is sometimes called a coercive voltage.

A ferroelectric capacitor typically exhibits a hysteresis characteristic. Current generally flows into a ferroelectric capacitor based on its polarization state. If a difference voltage between the electrodes of the ferroelectric capacitor is higher than the coercive voltage, the polarization state of the ferroelectric capacitor may be changed based on the polarity of a voltage applied to the ferroelectric capacitor. The capacitor's polarization state is generally maintained even after power-off, thus providing a ferroelectric memory device with a non-volatile characteristic. The ferroelectric capacitor may vary between polarization states in approximately 1 nanosecond. Thus, a device may be provided having a faster program time than non-volatile memories such as EPROMs and flash EEPROMs.

FIG. 1 illustrates a ferroelectric memory cell having a conventional one transistor/one capacitor (1T/1C) structure. A ferroelectric memory cell MC is provided having one switching transistor Tr and one ferroelectric capacitor Cf. One current electrode of the switching transistor Tr is connected to a bit line BL, and the other thereof is connected to a plate line PL. As illustrated in FIG. 1, a voltage Vp that is applied to the plate line PL. The voltage Vf is a division voltage (or a coupling voltage) between both electrodes of the ferroelectric capacitor Cf. The voltage Vf corresponds to the bit line voltage.

Read and write operations for such a ferroelectric memory device can be carried out by applying a pulse signal to a plate line PL connected to the ferroelectric capacitor Cf. As the ferroelectric capacitor generally has a high permittivity, the ferroelectric capacitor Cf may have a high capacitance. Furthermore, as a large number of ferroelectric capacitors are commonly connected to one plate line, a pulse signal applied to the plate line may have a long delay time (and/or a long rising time). Such a long delay time may reduce the operating speed of a ferroelectric memory, however, such a result may be unavoidable given the structure of a ferroelectric memory device. To increase the operating speed of the ferroelectric memory device, changes to the control logic other than adjusting the delay time of a pulse signal applied to the plate line may be desired when the delay time limitation is reached.

SUMMARY OF THE INVENTION

Embodiments of the present invention include ferroelectric memory devices having a ferroelectric memory cell. The ferroelectric memory cell has at least one bit line and a plate line. A control circuit drives the at least one bit line with write data substantially concurrently with activation of the plate line during a write operation. The memory devices may also include a sense amplifier coupled to the ferroelectric memory cell and the control circuit may be further configured to deactivate the plate line substantially concurrently with activation of the sense amplifier during a read operation.

In other embodiments of the present invention, the control circuit is configured to activate a column select signal coupled to the ferroelectric memory cell to drive the at least one bit line with write data. A leading edge of the plate line may correspond to activation of the plate line and a trailing edge of the plate line may correspond to deactivation of the plate line. A leading edge of the column select signal may drive the at least one bit line with write data and a trailing edge of the column select signal may decouple the at least one bit line from the write data.

In further embodiments of the present invention, the control circuit is configured to drive the at least one bit line with write data before activation of the plate line during the write operation. The control circuit may also be configured to deactivate the plate line substantially concurrently with activation of the sense amplifier during the write operation and/or a read operation. The control circuit may be further configured to deactivate the plate line during the read operation before activation of a column select signal coupled to the ferroelectric memory cell that drives the at least one bit line with write data.

In other embodiments of the present invention, ferroelectric memory devices are provided including a ferroelectric memory cell having a plate line. A sense amplifier is coupled to the ferroelectric memory cell. A control circuit deactivates the plate line substantially concurrently with activation of the sense amplifier during a read operation. The ferroelectric memory devices may further comprise a column select signal that couples the at least one bit line to a data signal and the control circuit may be configured to deactivate the plate line during the read operation before activation of a column select signal. The control circuit may be configured to drive the at least one bit line with write data substantially concurrently with activation of the plate line during a write operation.

In further embodiments of the present invention, methods are provided for writing to a memory cell of a ferroelectric memory device, the memory cell having at least one bit line and a plate line. The method includes substantially concurrently driving the at least one bit line with write data and activating the plate line.

In other embodiments of the present invention, substantially concurrently driving the at least one bit line with write data and activating the plate line includes driving the at least one bit line with write data and then activating the plate line. The memory cell may be coupled to a sense amplifier and substantially concurrently driving the at least one bit line with write data and activating the plate line may be followed by substantially concurrently deactivating the plate line and activating the sense amplifier. In particular embodiments, the plate line is deactivated during a read operation before activation of a column select signal coupled to the memory cell that couples the at least one bit line to a data signal.

In further embodiments of the present invention, methods are provided for reading from a memory cell of a ferroelectric memory device, the memory cell having a plate line and a sense amplifier coupled to the memory cell. The method includes substantially concurrently deactivating the plate line and activating the sense amplifier. The ferroelectric memory cell may further include at least one bit line and the device may farther comprise a column select signal that couples the at least one bit line to a data signal. In such embodiments, the method may further comprise deactivating the plate line before activation of the column select signal.

In accordance with other embodiments of the present invention, there is provided a ferroelectric memory device which includes a ferroelectric memory cell coupled to a word line, a plate line, and a bit line. A plate line driver drives the plate line, and a row decoder drives the word line in response to a row address. A sense amplifier senses and amplifies a voltage on the bit line, and a column select circuit selectively connects the bit line with a data line in response to a column address. A data input circuit transfers data from the outside to the data line, and a control logic for controlling operational timing of the plate line driver, the column select circuit, the sense amplifier circuit, and the data input circuit. The control logic generates first to fourth control signals, the plate line driver enabled by the first control signal, the sense amplifier circuit enabled by the second and third control signals, and the column select circuit enabled by the fourth control signal. The fourth control signal is activated before the activation of the first control signal in a write operation.

In this embodiment, the data from the outside is loaded on the data line via the data input circuit before the activation of the column select circuit, in the write operation. The control logic enables the column select circuit after the activation of the sense amplifier circuit in a read operation. The control logic comprises a first signal generator for sequentially generating the first control signal and the second and third control signals in response to a chip enable signal, and a second signal generator for generating the fourth control signal in response to a write enable signal, the chip enable signal, and the first sense amp control signal.

In this embodiment, the second signal generator activates the fourth control signal before the activation of the first control signal in response to the activation of the write enable signal indicating the write operation. The activated column control signal is inactivated depending on the inactivation of the second control signal, in the write operation.

In this embodiment, the second signal generator activates the column control signal in response to the activation of the second control signal, in a read operation. The activated column control signal is inactivated depending on the inactivation of the second control signal, in the read operation.

In this embodiment, the first signal generator inactivates the first activated control signal after the activation of the second and third control signals, in read and write operations.

BRIEF DESCRIPTION OF THE DRAWINGS

Other features of the present invention will be more readily understood from the following detailed description of the invention when read in conjunction with the accompanying drawings, in which.

DETAILED DESCRIPTION OF THE INVENTION

Figure 1:
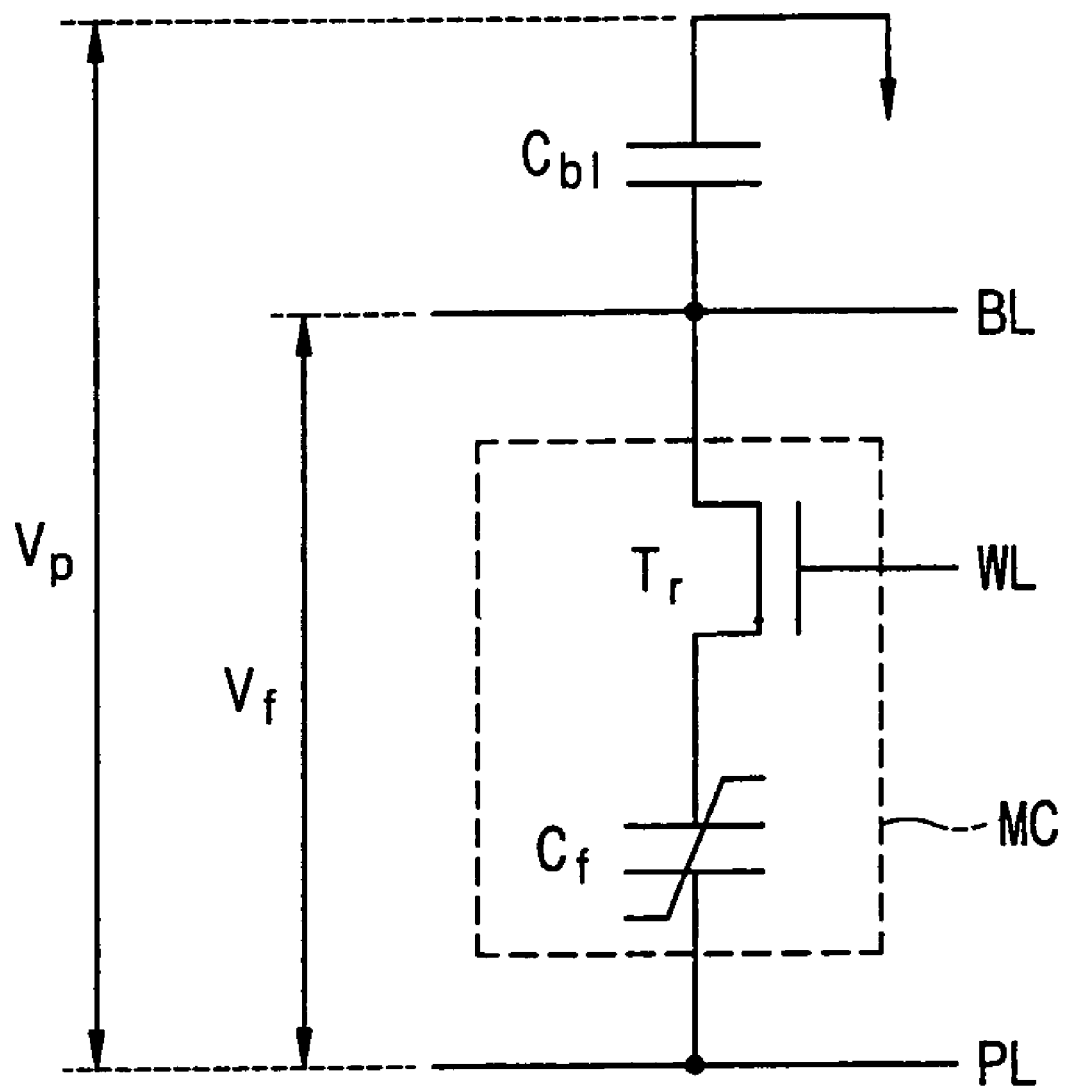
FIG. 1 is a circuit diagram of a conventional ferroelectric memory cell.

The present invention now will be described more fully hereinafter with reference to the accompanying drawings, in which typical embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity. It will be understood that when an element such as a device or circuit component is referred to as being "couple" or "connected" to another device, it can be directly coupled to the other device or intervening devices may also be present. In contrast, when a device is referred to as being "directly" coupled or connected to another device, there are no intervening devices present. Furthermore, while timing diagrams used herein generally associate rising edges and a high level with activation and falling edges and a low level with deactivation, it is to be understood that embodiments using the opposite logic state also fall within the scope of the present invention. Moreover, each embodiment described and illustrated herein includes its complementary conductivity type embodiment as well.

Integrated circuit devices and methods for forming such devices in accordance with embodiments of the present invention will now be described with reference to FIGS. 2–6B. To simplify understanding of the present disclosure, the various embodiments of the present invention described herein will be described with reference to a memory device, more particularly, a random access memory device. However, the present invention can be applied to devices other than memory devices.

Figure 2:
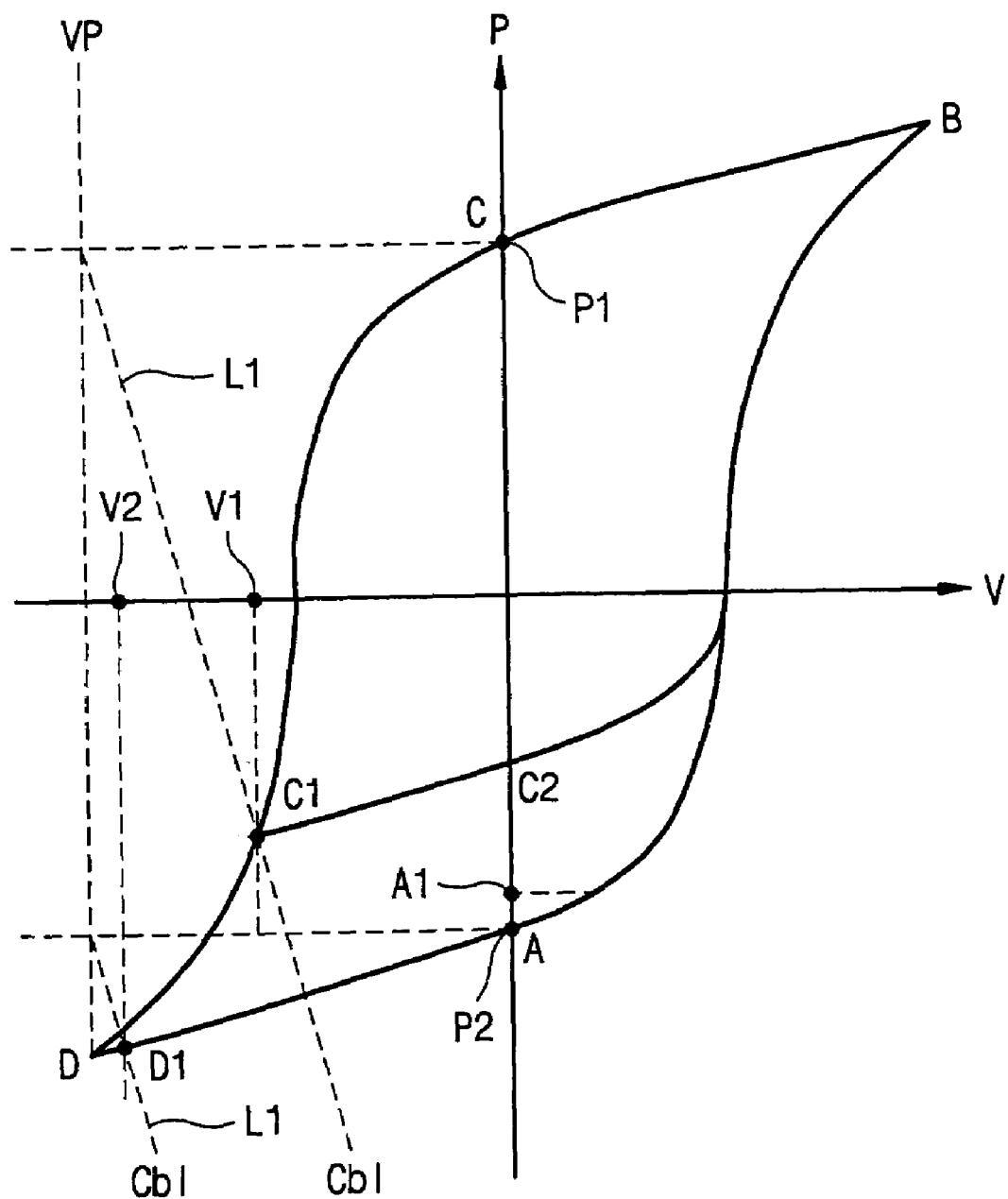
FIG. 2 is a graph illustrating a hysterisis characteristic of a ferroelectric material interposed between electrodes of a ferroelectric capacitor of a ferroelectric memory cell according to some embodiments of the present invention.

FIG. 2 is a graph illustrating a hysterisis switching loop of a ferroelectric capacitor. In FIG. 2, the abscissa indicates the potential difference (V) between the electrodes of the ferroelectric capacitor (i.e., the voltage between the electrodes). The ordinate indicates the amount of charge induced on a surface of the ferroelectric capacitor due to spontaneous polarization, that is, the degree of polarization (P) ($\mu C/cm^2$). The point marked "C" corresponds to the first polarization state P1 and the point marked "A" corresponds to the second polarization state P2. The first polarization state P1 corresponds to a first data state, shown as a high "H" data stored in the ferroelectric capacitor Cf The second polarization state P2 corresponds to a second data state, shown as a low "L" data stored in the ferroelectric capacitor Cf.

In order to detect a polarization state of the ferroelectric capacitor Cf, a division voltage Vf generated between the electrodes of the ferroelectric capacitor Cf becomes a V1 voltage level when the ferroelectric capacitor Cf has the first polarization state P1 and a V2 voltage level when the ferroelectric capacitor Cf has the second polarization state P2. Assuming that the capacitance of a load capacitor Cb1 (FIG. 1) has a slope of the line L1, the division voltage Vf can be varied based on the capacitance of the load capacitor Cb1. By comparing the division voltage Vf with a predetermined reference voltage, it is possible to detect a polarization state of the ferroelectric capacitor Cf. In other words, it may be possible to detect whether the ferroelectric capacitor Cf has the first polarization state P1 or the second polarization state P2.

Figure 3A:
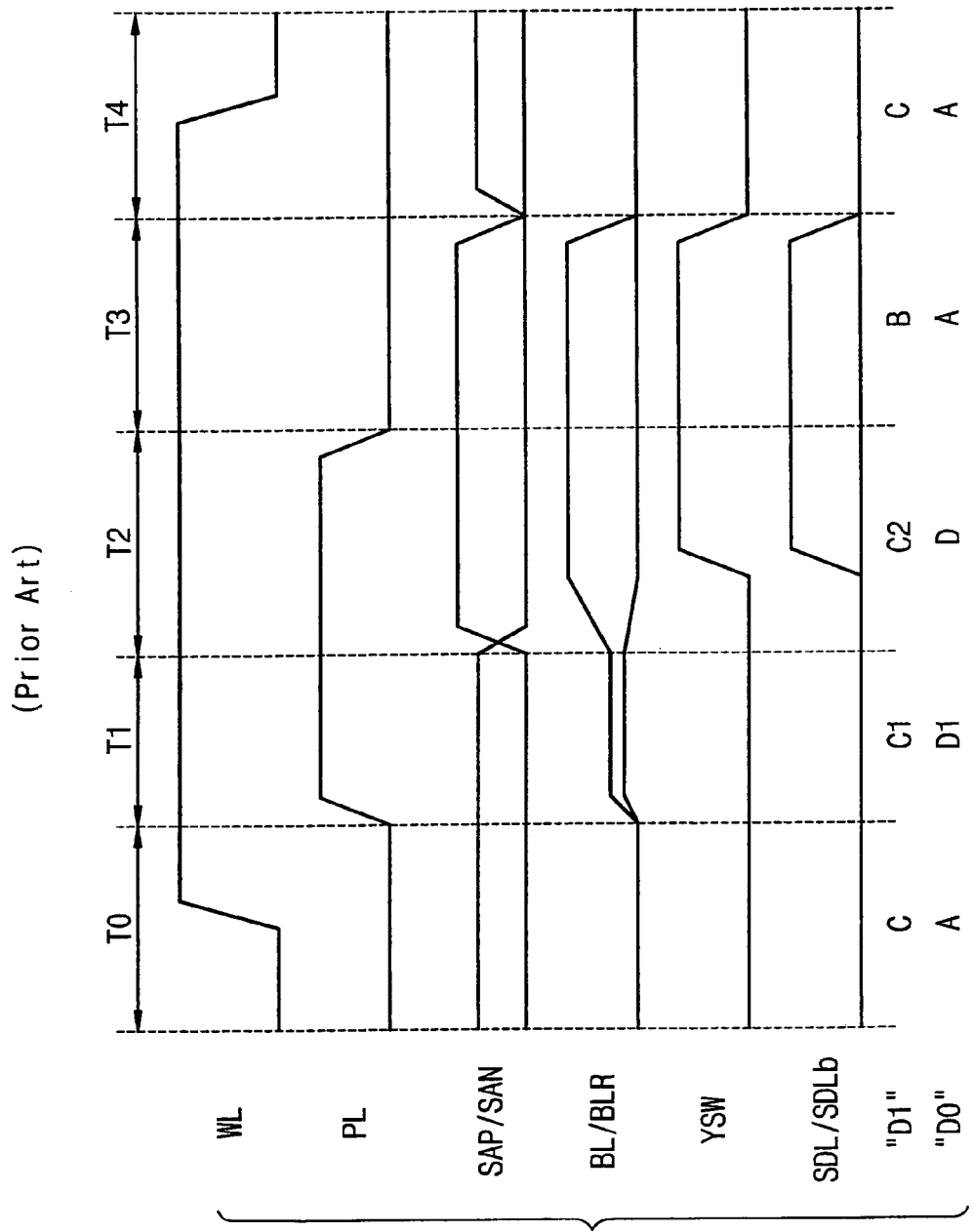
FIG. 3A is a timing diagram illustrating a read operation of a conventional ferroelectric memory device.

FIG. 3A is a timing diagram illustrating a read operation of a conventional ferroelectric memory device. As shown in time period T0, once a read operation commences, a selected word line WL is activated, based on decoding of an externally applied address, to turn on the switching transistors Tr (FIG. 1) of memory cells connected to the activated word line. At the end of the T0 period, following activation of the word line WL, a bit line BL connected to each of the ferroelectric memory cells MC is grounded and then the bit line pair BL/BLR is placed in a floating state. Data stored in the ferroelectric memory cells MC of the activated word line is then transferred onto corresponding bit lines BL/BLR during time period T1. More particularly, as shown in FIG. 3A, a pulse signal of a Vcc level is applied to the plate line PL, that is, to one electrode of each of the ferroelectric capacitors Cf coupled to the plate line PL. As a result, a division voltage (or a coupling voltage) Vf is generated between the electrodes of each of the ferroelectric capacitors Cf. The division voltage Vf may be read as will now be further described.

When "1" (or "H") data is stored in a ferroelectric capacitor Cf (i.e., when the ferroelectric capacitor Cf has the first polarization state P1), the Vf voltage becomes a V1 voltage level. Accordingly, the polarization state of the ferroelectric capacitor Cf storing "1" data is changed from the point "C" to the point "C1" in FIG. 2. When "0" (or "L") data is stored in the ferroelectric capacitor Cf (that is, when the ferroelectric capacitor Cf has the second polarization state P2), the Vf voltage becomes a V2 voltage level. Accordingly, the polarization state of the ferroelectric capacitor Cf storing "0" data is changed from point "A" to point "D1." A division voltage Vf dependent on the stored data is measured based on the resulting voltage data value induced on a corresponding bit line (or across a corresponding bit line pair).

During time period T2, the division voltage Vf (in FIG. 2, V1 or V2) induced on each bit line BL (or bit line pair BL/BLR) is amplified to either a ground voltage or an operating voltage (such as a power supply voltage) through a comparison operation, for example, with a reference voltage. As a sense amplification operation is carried out (SAP/SAN activated) and a column selection signal YSW is activated, data on a selected bit line(s) BL (BL/BLR) is transferred to a data line(s) SDL (SDL/SDLb) through, for example, a column pass gate circuit.

A ferroelectric capacitor Cf that originally stores "0" data generally has a polarization state, shown by a point "D1" in FIG. 2, that is less than at the point "D" as a result of a read operation carried out in the T1 period. A sense amplification operation is carried out in the period T2 where the polarization state of a ferroelectric capacitor Cf is detected. In time period T3, the plate line PL signal deactivates (shown as a transition from a high level to a low level). In other words, a ground voltage is applied to the plate line PL instead of a power supply voltage. As a result of this bias condition, a data restore operation is provided for ferroelectric capacitor(s) Cf that store "1" data. Read operations complete with an initialization operation in time period T4.

Figure 3B:
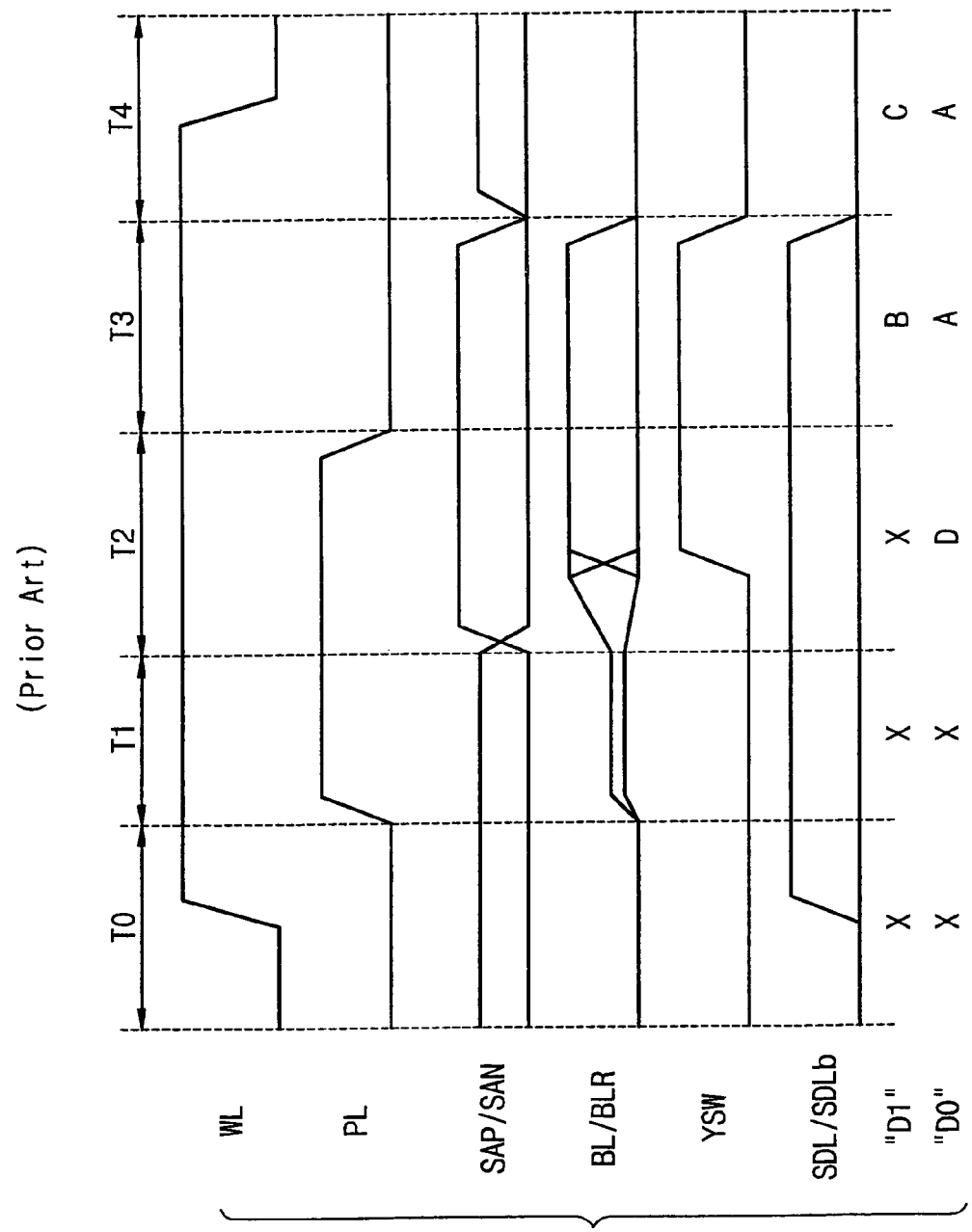
FIG. 3B is a timing diagram illustrating a write operation of a conventional ferroelectric memory device.

FIG. 3B is a timing diagram illustrating a write operation for a conventional ferroelectric memory device. Once a write operation commences, in time period T0, a selected word line WL is activated, based on decoding of an externally applied address, to turn on switching transistors Tr of ferroelectric memory cells MC connected to the activated word line. Also during time period T0, data to be written to a ferroelectric memory cell(s) is loaded on a data line(s) through a decoding process. The bit line BL (or bit line pair BL/BLR) connected to each of the ferroelectric memory cells MC is grounded and then placed in a floating state. During the time period T1, responsive to a pulse signal of a Vcc level applied to the plate line PL, data stored in ferroelectric memory cells MC of the activated word line WL is transferred onto corresponding bit lines.

During time period T2, a sense amplification operation is performed (SAP/SAN activated) and a column selection signal YSW is activated. As a result, external data on a data line(s) SDL (SDL/SDLb) may be transferred to the selected bit line(s) BL (BL/BLR). Thus, the voltage on the selected bit line or bit line pairs is varied responsive to data on the data line SDL (SDL/SDLb). For example, when a bit line BL is at a ground voltage and a data line SDL is at a power supply voltage level, the voltage of the bit line BL is changed from the ground voltage to the power supply voltage. When the bit line BL and the data line SDL both are at the ground voltage or the power supply voltage, the voltage of the bit line BL is maintained at an unchanged logic level. Because the plate line PL is activated to the power supply voltage level in the T2 period, "0" data may be stored in a memory cell(s). A ferroelectric capacitor Cf that stores "0" data has a polarization state of the point "D" in FIG. 2.

In the time period T3, the plate line PL signal transitions from a high level to a low level (deactivates). Thus, a ground voltage is applied to the plate line PL instead of a power supply voltage. Under this bias condition, a data restore operation may be carried out with respect to a ferroelectric capacitor that stores "1" data while the external data of "1" is stored in a memory cell(s). An initialization operation is performed in a period T4 to complete the read operation.

As described above, conventional read and write operations are generally, respectively, carried out over five time periods T0–T4, wherein an address is decoded in the period T0, cell data is transferred to a bit line in the period T1, "0" data is written or restored in the period T2, "1" data is written or restored in the period T3 and an initialization operation is carried out in the period T4.

Figure 4:
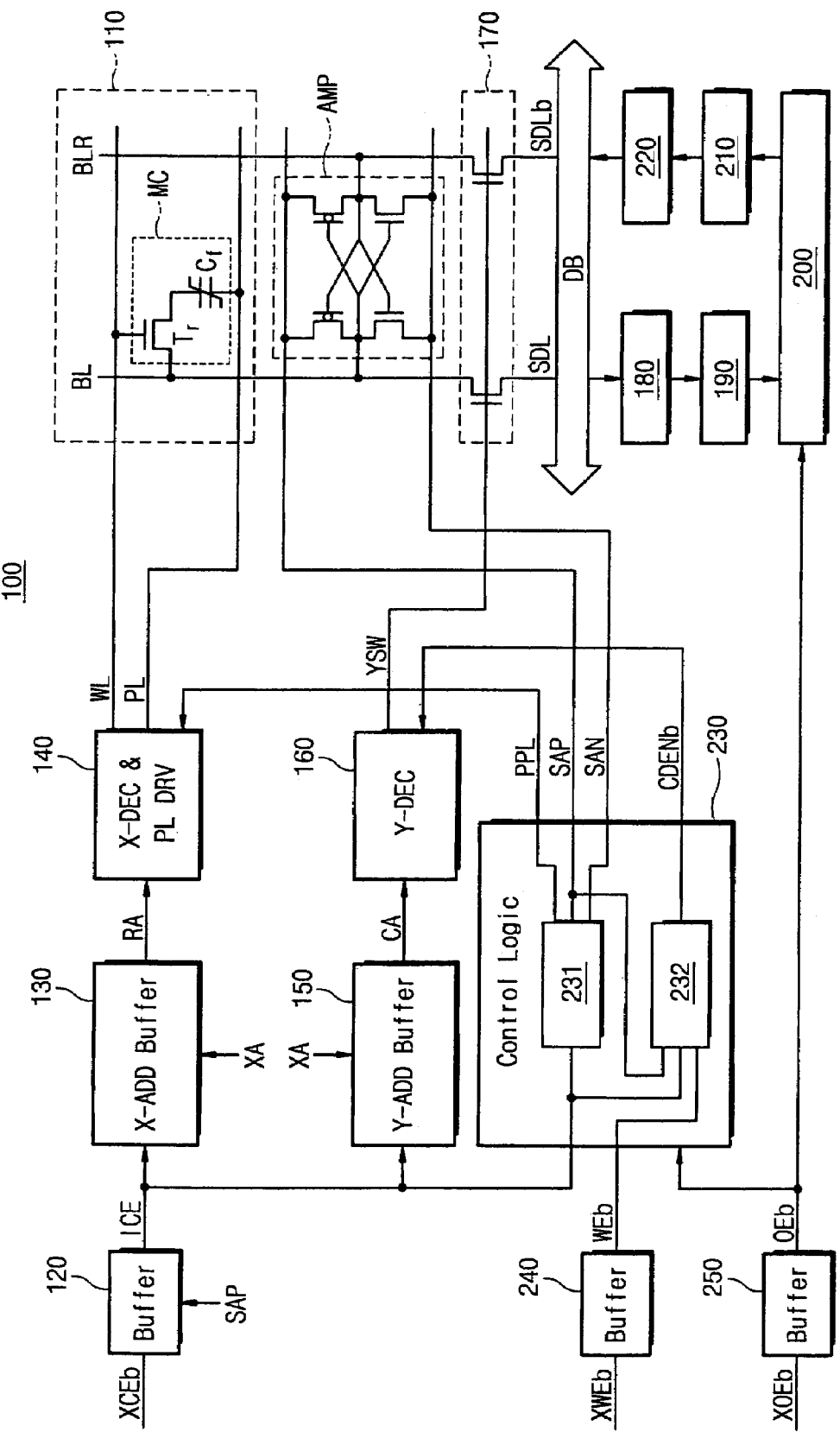
FIG. 4 is a block circuit diagram illustrating a ferroelectric memory device according to some embodiments of the present invention.

FIG. 4 is a block circuit diagram of a ferroelectric memory device 100 according to some embodiments of the present invention. As shown in FIG. 4, the ferroelectric memory device 100 includes a memory cell array 110, which includes a plurality of ferroelectric memory cells MC arranged in a matrix of rows and columns. Each row is defined by a word line WL and a plate line PL. Alternatively, other arrangements may be provided, for example, where each row is formed so that one plate line is shared by two word lines. Each column is illustrated as being formed of a pair of bit lines BL and BLR. For ease of understanding the present invention, only one ferroelectric memory cell MC is illustrated in FIG. 4 and the illustrated ferroelectric memory cell MC includes a switching transistor Tr and a ferroelectric capacitor Cf. One current electrode of the switching transistor Tr is connected to the bit line BL and the other is connected to one electrode of the ferroelectric capacitor Cf. A gate of the switching transistor Tr is connected to the word line WL. The other electrode of the ferroelectric capacitor Cf is connected to the plate line PL.

Also shown in the device 100 of FIG. 4 is a sense amplifier AMP that is connected between the bit lines BL and BLR and senses and amplifies a voltage difference between the bit lines BL and BLR of each pair in response to control signals SAN and SAP. A chip enable buffer 120 receives an external chip enable signal XCEb to generate an internal chip enable signal ICE. The internal chip enable signal ICE is deactivated when the control signal SAP is deactivated (e.g., in response to a high-low transition of the control signal SAP). A row address buffer 130 receives row address information in response to the internal chip enable signal ICE. A row decoder and plate line driver block 140 selects one of the rows in response to a row address RA from the row address buffer 130 and drives a word line of the selected row with a word line voltage VPP. A column address buffer 150 receives column address information in response to the internal chip enable signal ICE. A column decoder 160 decodes a column address CA from the column address buffer 150 in response to a control signal CDENb and activates a column selection signal YSW based on the decoding result.

As illustrated in FIG. 4, a column pass gate circuit 170 selects particular column(s) in response to the column selection signal YSW from the column decoder 160. The selected columns are connected to a data bus DB via the column pass gate circuit 170. As described above, each column in the embodiments of FIG. 4 is formed of a pair of bit lines, and the data bus DB is formed of data line pairs. For example, a pair of bit lines BL and BLR is electrically connected to a corresponding pair of data lines SDL and SDLb through the column pass gate circuit 170. For a read operation, read-out data on the data bus DB is output externally via a read driver 180, a data output buffer 190, and an input/output driver 200. For a write operation, externally applied data is transferred onto the data bus DB via the input/output driver 200, a data input buffer 210, and a write driver 220. The drivers 180 and 220 and the buffers 190 and 210 may be selectively controlled by a control logic 230 based on a read and a write operation sequence.

The control logic 230 may operate responsive to the internal chip enable signal ICE, a write enable signal WEb from a buffer 240, and an output enable signal OEb from a buffer 250. As shown in FIG. 4, the control logic 230 includes a delay chain 231 for sequentially generating control signals PPL, SAN and SAP, and a signal generator 232 for generating the control signal CDENb that is used to control the column decoder 160. More particularly, the delay chain 231 of the control logic 230 sequentially generates the control signals PPL, SAP and SAN in response to activation of the internal chip enable signal ICE. The signal generator 232 generates the control signal CDENb in response to the internal chip enable signal ICE, the control signal SAP, and the write enable signal WEb. The control signal PPL is transferred to the row decoder and plate line driver block 140, which drives a plate line PL of the selected row with a predetermined voltage in response to the control signal PPL. The control signals SAP and SAN are provided to the sense amplifier AMP, which operates responsive to the control signals SAN and SAP. The control signal CDENb is provided to the column decoder 160, which operates responsive to the control signal CDENb.

Figure 5:
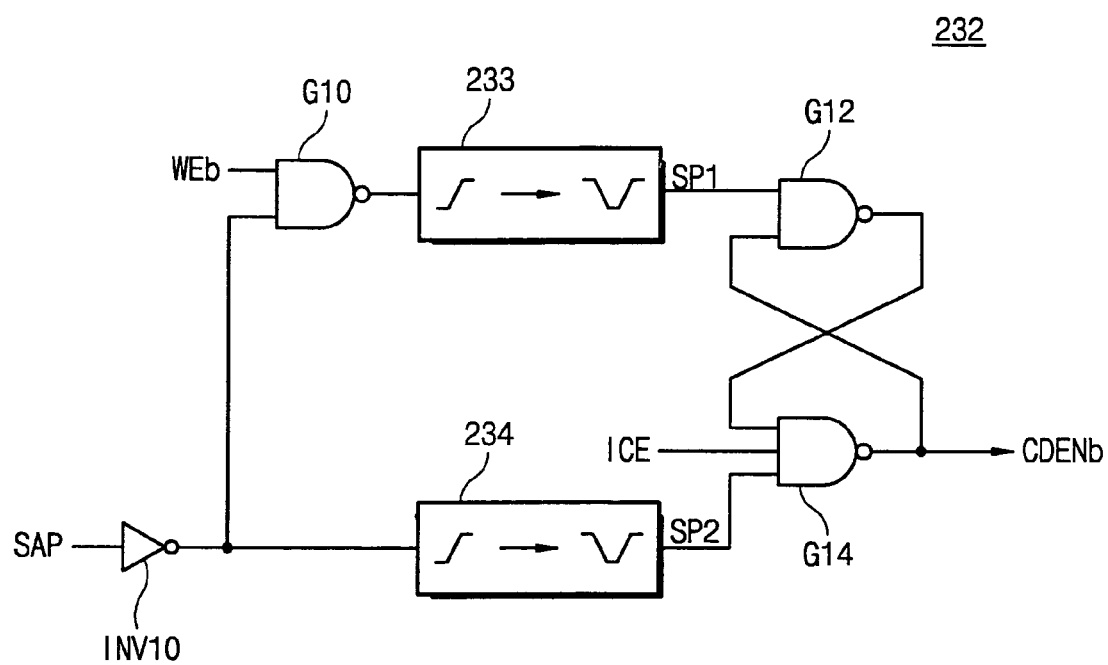
FIG. 5 is a circuit diagram illustrating a portion of the control logic circuit of FIG. 4 according to some embodiments of the present invention.

FIG. 5 illustrates embodiments of the signal generator 232 in the control logic 230 illustrated in FIG. 4 according to some embodiments of the present invention. As illustrated in FIG. 5, the signal generator 232 operates responsive to control signals ICE, SAP and WEb, and includes NAND gates G10, G12, and G14, an inverter INV10, and short pulse generators 233 and 234. The signal generator 232 operates responsive to activation of the internal chip enable signal ICE. For the illustrated embodiment of a signal generator 232, activation and inactivation timings of the control signal CDENb are controlled differently for read and write operations. During a write operation, the control signal CDENb may be activated in synchronization with activation of the WEb signal and may be deactivated in synchronization with deactivation of the SAP signal. During a read operation, the control signal CDENb may be activated and deactivated in synchronization with activation and deactivation of the SAP signal, respectively, irrespective of the WEb signal.

By way of example, when the write enable signal WEb transitions from a high level to a low level and the control signal SAP is at a low level, an output of the NAND gate G10 transitions from the low level to the high level. The short pulse signal circuit 233 generates a short pulse signal SP1 in response to a low-to-high transition of the output of the NAND gate G10. This enables the control signal CDENb to transition from the high level to the low level. In other words, the control signal CDENb may be activated in synchronization with a high-to-low transition of the write enable signal WEb. The short pulse generator 234 generates a short pulse signal SP2 when an output of the inverter INV10 transitions from the low level to the high level. This makes the control signal CDENb transition from the low level to the high level. In other words, the activated control signal CDENb is deactivated in synchronization with a high-to-low transition of the control signal SAP.

For a read operation (or while the write enable signal WEb is maintained high), the NAND gate G10 outputs a signal having a low-to-high transition when the control signal SAP transitions from the low level to the high level. The short pulse signal circuit 233 generates the short pulse signal SP1 responsive to a low-to-high transition of an output signal from the NAND gate G10. This makes the control signal CDENb transition from the high level to the low level. Accordingly, the control signal CDENb is activated in synchronization with a high-to-low transition of the write enable signal WEb. Subsequently, when the control signal-SAP transitions from the high level to the low level, the short pulse generator 234 generates the short pulse signal SP2 responsive to an output signal of the inverter INV10. This enables the control signal CDENb to transition from the low level to the high level. Accordingly, the control signal CDENb is deactivated in synchronization with a high-to-low transition of the control signal SAP.

Figure 6A:
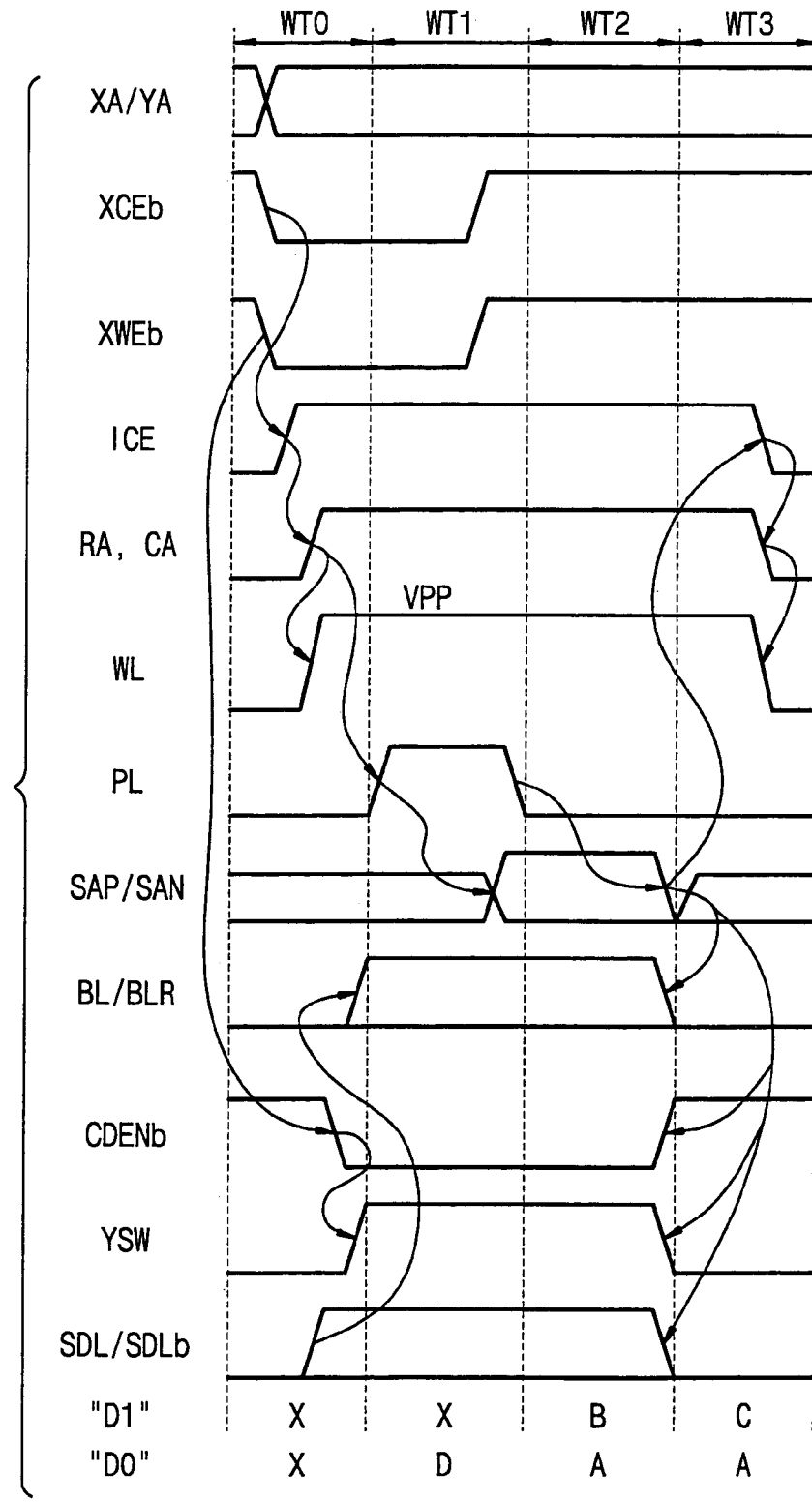
FIG. 6A is a timing diagram illustrating a write operation of a ferroelectric memory device according to some embodiments of the present invention.

FIG. 6A is a timing diagram illustrating a write operation of a ferroelectric memory device according to some embodiments of the present invention. Once a write operation starts, the XCEb and XWEb signals transition from a high level to a low level in the time period WT0. As the XCEb signal transitions from the high level to the low level, row and column address buffers 130 and 150 (FIG. 4) respectively receive external row and column addresses responsive to an internal chip enable signal ICE. The row decoder and plate line driver block 140 selects a row, in response to a row address RA from the row address buffer 130, and drives a word line of the selected row with a predetermined word line voltage. Substantially simultaneously, the signal generator 232 of control logic 230 activates the control signal CDENb low when the XWEb signal transitions from the high level to the low level. The column decoder 160 activates the column selection signal YSW responsive to a column address CA from the column address buffer 150 when the control signal CDENb is activated low. Thus, decoding of the row and column addresses is carried out in the WT0 period.

In time period WT1, as the column selection signal YSW is activated, external data on the data bus DB is transferred to columns that are selected through the column pass gate circuit 170. The delay chain 231 of the control logic 230 activates a control signal PPL responsive to the internal chip enable signal ICE. The row decoder and plate line driver block 140 drives the plate line PL of the selected row in response to activation of the control signal PPL. When the plate line PL is driven (activated), data stored in memory cells of the selected row is transferred onto corresponding bit lines while a write operation may also be carried out for cells to receive "0" data. More particularly, when a ground voltage corresponding to "0" data is applied to a bit line and a power supply voltage is applied to a plate line PL, "0" of write data bits transferred onto the selected columns are written into corresponding memory cells. With reference to FIG. 2, a ferroelectric capacitor in a memory cell that stores "0" data has a polarization state of "D."

The control logic 230 activates the control signal SAP high and the control signal SAN low a selected time delay period after the control signal PPL is activated. The control logic 230 activates the control signals SAP and SAN and substantially concurrently deactivates the control signal PPL. As a result, the plate line PL signal transitions from a high level of a power supply voltage to a low level of a ground voltage (deactivates). Under this voltage bias condition, "1" write data bits are written in corresponding memory cells having "1" data bits to be written while a data restore operation is performed with respect to ferroelectric capacitors that already were storing "1" data. Thus, restore and write operations for "1" data are carried out in period WT2.

The exemplary write operations of FIG. 6A are associated with the corresponding data states with reference to the curve of FIG. 2 at the bottom of FIG. 6A. Thus, a ferroelectric capacitor corresponding to "0" data (D0) has a polarization state of "A" and a ferroelectric capacitor corresponding to "1" data (D1) has a polarization state of "B" after the operations in period WT1 and WT2.

After the data restore and write operations are performed in the WT2 period, an initialization operation for the ferroelectric memory device is performed in the WT3 period. More particularly, as the control signal SAP is deactivated (low), the internal chip enable signal ICE is deactivated (low). As a result, outputs of the buffers 130 and 150 and the block 140 are initialized sequentially. At substantially the same time, the control signal CDENb is deactivated in synchronization with a high-to-low transition of the control signal SAP so that an output of the column decoder 160 is reset.

As described for the illustrated embodiments of the present invention during a write operation, while data stored in memory cells of a selected row is transferred onto bit lines (i.e., while the bit lines are coupled to the cell capacitors), a write operation may be carried out for "0" data. The control logic 230 performs a control operation so that write data from the external is transferred onto selected bit lines. Therefore, by carrying out both these operations in a single time period, the operating speed of a ferroelectric memory device according to embodiments of the present invention may be increased by a period (a restore period of "0" data) as compared with the write operation illustrated in the timing diagram of FIG. 3B.

Figure 6B:
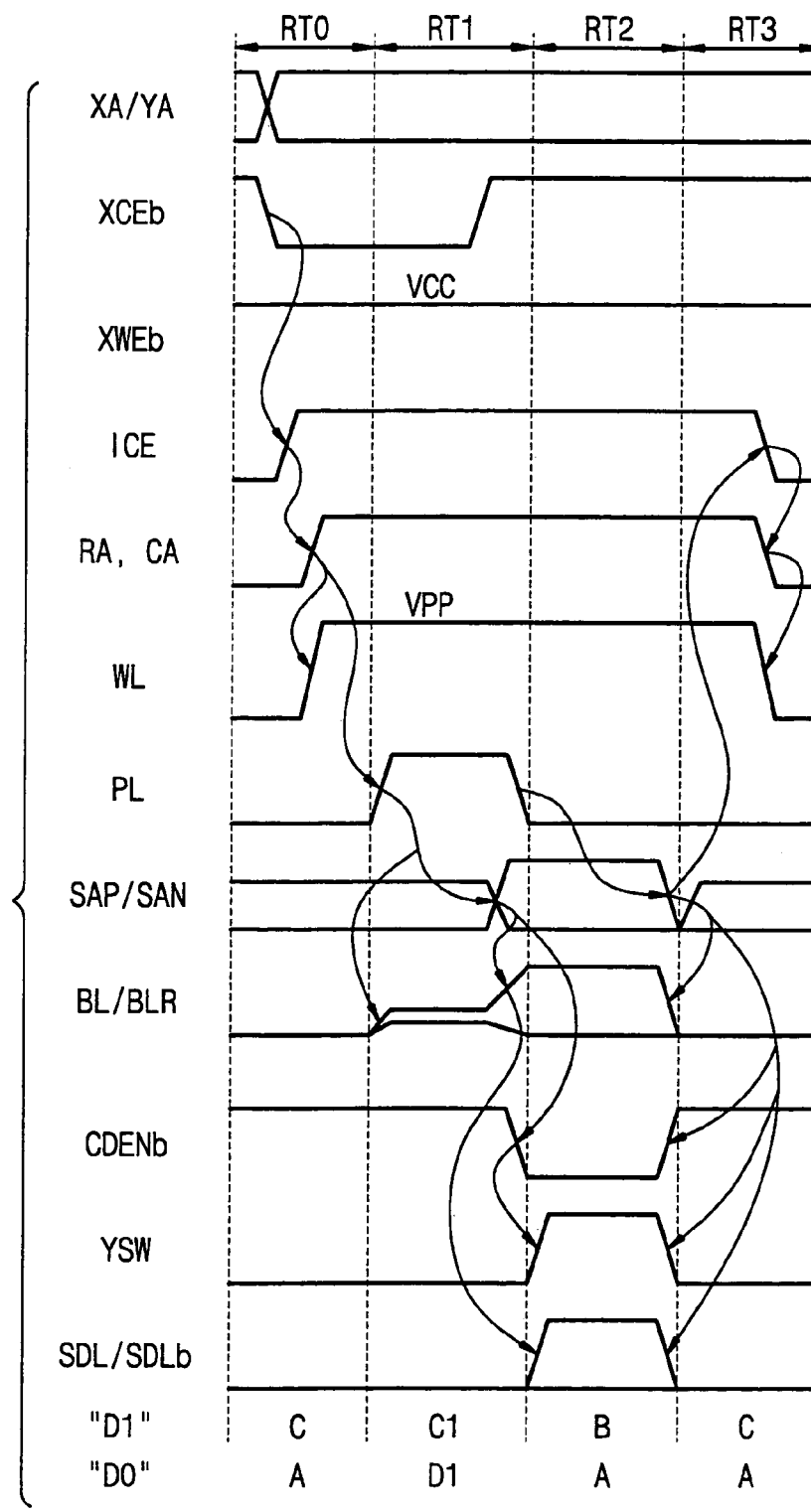
FIG. 6B is a timing diagram illustrating a read operation of a ferroelectric memory device according to some embodiments of the present invention.

FIG. 6B is a timing diagram illustrating a read operation according to some embodiments of the present invention. When the read operation begins, an XCEb signal transitions from a high level to a low level in the RT0 time period. As the XCEb signal transitions from the high level to the low level, row and column address buffers 130 and 150 (FIG. 4) respectively receive external row and column addresses responsive to the internal clock signal ICE. The row decoder and plate line driver block 140 selects one of rows, responsive to the row address RA from the buffer 130, and drives the word line WL of the selected row with a predetermined word line voltage. Unlike the above-described write operation, the control signal CDENb is maintained high as the XWEb signal is at the high level. Thus, the row address is decode during the RT0 period.

The delay chain 231 of the control logic 230 activates the control signal PPL responsive to the internal chip enable signal ICE. The block 140 drives (activates) the plate line PL of the selected row responsive to activation of the control signal PPL. With the plate line PL activated, data in memory cells of the selected row is transferred onto bit lines. At this time, a ferroelectric capacitor storing "0" data has a polarization state of "D1" and a ferroelectric capacitor storing "1" data has a polarization state of "C1" (FIG. 2).

During the RT1 time period, the control logic 230 activates the control signal SAP high and the control signal SAN low. This enables voltages on bit lines BL and BLR of each pair to be amplified either up, respectively, to a power supply voltage/ground voltage or to the ground voltage/power supply voltage by the sense amplifier (i.e., activates the sense amplifier). As the plate line PL is activated to the power supply voltage, the polarization state of a ferroelectric capacitor storing "0" data is changed from "D1" to "D" (FIG. 2). As further illustrated in the embodiments of FIG. 6B, the plate line PL is deactivated promptly after the sense amplifier AMP is activated responsive to activation of the control signals SAP and SAN.

The signal generator 232 of the control logic 230 activates the control signal CDENb responsive to a low-to-high transition of the control signal SAP. The column decoder 160 activates the column selection signal YSW responsive to a column address CA from the buffer 150 when the control signal CDENb is activated low. When the column selection signal YSW is activated, data on selected columns is transferred onto the data bus DB through the column pass gate circuit 170. The data on the data bus DB is externally output through the read driver 180, the data output buffer 190, and the input/output driver 200 under the control of the control logic 230. While externally outputting the read-out data, a data restore operation is performed with respect to a ferroelectric capacitor that originally stores "1" data. Thus, the restore operation for "1" data is carried out in the RT2 time period.

After the data restore operation, an initialization operation of the ferroelectric memory device is performed in the RT3 time period. More particularly, as the control signal. SAP is inactivated low, the internal chip enable signal ICE is inactivated low. This causes outputs of the buffers 130 and 150 and the block 140 to be sequentially initialized. At substantially the same time, the control signal CDENb is inactivated, responsive to a high-to-low transition of the control signal SAP, so that an output of the column decoder 160 is reset.

For write and read operations according to embodiments of the present invention, the plate line PL is inactivated after operation of the sense amplifier AMP. If the plate line PL is inactivated before operation of the sense amplifier AMP, a known depolarization phenomenon may arise, which may result in a sensing margin decrease. For example, in FIG. 2, the polarization state of a ferroelectric capacitor that stores "0" data is changed to a point "A1" from a point "A." Such a depolarization phenomenon is further described in U.S. Pat. No. 5,579,258 entitled "FERROELECTRIC MEMORY". Accordingly the plate line PL may be inactivated after the sense amplifier AMP operates (or after a bit line is set to a ground voltage) as described for the embodiments of the present invention shown in FIGS. 6A and 6B. Thus, the time period from operation of the sense amplifier AMP to a high-to-low (deactivation) transition of the plate line signal may be shorter than a high-going (rise) time of a bit line that is connected to a ferroelectric memory cell having "1" data that is amplified by the sense amplifier AMP.

As described above, for some embodiments of the present invention, while data in a memory cell(s) of a selected row is transferred to a bit line(s) (i.e., the cell(s) are coupled to the bit lines), a write operation may be performed for "0" data. As a result, the time needed for a write operation may be shortened. In further embodiments, during a read operation, while data in a memory cell(s) of a selected row is transferred to a bit line(s), a plate line is inactivated promptly after operation (activation) of a sense amplifier. Thus, the time needed for a restore operation of "0" data may be shortened. Accordingly, the operating speed of ferroelectric memory devices according to embodiments of the present invention may be improved.

It should be noted that many variations and modifications may be made to the embodiments described above without substantially departing from the principles of the present invention. All such variations and modifications are intended to be included herein within the scope of the present invention, as set forth in the following claims.

We claim:

1. A ferroelectric memory device comprising:
    a ferroelectric memory cell having a plate line;
    a sense amplifier coupled to the ferroelectric memory cell; and
    a control circuit that deactivates the plate line substantially concurrently with activation of the sense amplifier during a read operation and maintains the plate line deactivated for a remainder of the read operation.

2. The ferroelectric memory device of claim 1 wherein the ferroelectric memory cell further comprises at least one bit line and wherein the device further comprises a column select signal that couples the at least one bit line to a data line and wherein the control circuit is further configured to deactivate the plate line during the read operation before activation of the column select signal.

3. The ferroelectric memory device of claim 2 wherein the control circuit is configured to drive the at least one bit line with write data substantially concurrently with activation of the plate line during a write operation.

4. A method for reading from a memory cell of a ferroelectric memory device, the memory cell having a plate line and a sense amplifier coupled to the memory cell, the method comprising:
    substantially concurrently deactivating the plate line and activating the sense amplifier; and
    maintaining the plate line deactivated for a remainder of the read operation.

5. The method of claim 4 wherein the ferroelectric memory cell further comprises at least one bit line and wherein the device further comprises a column select signal that couples the at least one bit line to a data line and wherein the method further comprises deactivating the plate line before activation of the column select signal.

6. A ferroelectric memory device comprising:
    a ferroelectric memory cell having a plate line;
    a sense amplifier coupled to the ferroelectric memory cell; and
    a control circuit that deactivates the plate line substantially concurrently with activation of the sense amplifier during a read operation;
    wherein the ferroelectric memory cell is coupled to a word line, a plate line, and a bit line and wherein the sense amplifier is configured to drive the word line in response to a row address and wherein the ferroelectric memory device further comprises;
    a plate line driver for driving the plate line;
    a row decoder for driving the word line in response to a row address;
    a column select circuit for selectively connecting the bit line with a data line in response to a column address;
    a data input circuit for transferring data from the outside to the data line; and wherein the control circuit comprises:
a control logic for controlling operational timing of the plate line driver, the column select circuit, the sense amplifier circuit, and the data input circuit,
wherein the control logic generates first to fourth control signals, the plate line driver enabled by the first control signal, the sense amplifier circuit enabled by the second and third control signals, and the column select circuit enabled by the fourth control signal; and wherein the fourth control signal is activated before the activation of the first control signal in a write operation.

7. The ferroelectric memory device of claim 6, wherein the data from the outside is loaded on the data line via the data input circuit before the activation of the column select circuit, in the write operation.

8. The ferroelectric memory device of claim 6, wherein the control logic enables the column select circuit after the activation of the sense amplifier circuit in a read operation.

9. The ferroelectric memory device of claim 6, wherein the control logic comprises:
a first signal generator for sequentially generating the first control signal and the second and third control signals in response to a chip enable signal; and
a second signal generator for generating the fourth control signal in response to a write enable signal, the chip enable signal, and the first sense amp control signal.

10. The ferroelectric memory device of claim 9, wherein the second signal generator activates the fourth control signal before the activation of the first control signal in response to the activation of the write enable signal indicating the write operation.

11. The ferroelectric memory device of claim 10, wherein the activated column control signal is inactivated depending on the inactivation of the second control signal, in the write operation.

12. The ferroelectric memory device of claim 9, wherein the second signal generator activates the column control signal in response to the activation of the second control signal, in a read operation.

13. The ferroelectric memory device of claim 12, wherein the activated column control signal is inactivated depending on the inactivation of the second control signal in the read operation.

14. The ferroelectric memory device of claim 10, wherein the first signal generator inactivates the first activated control signal after the activation of the second and third control signals, in read and write operations.

* * * * *